United States Patent
Ohmi et al.

(10) Patent No.: US 7,449,719 B2
(45) Date of Patent: Nov. 11, 2008

(54) SEMICONDUCTOR DEVICE AND METHOD OF MANUFACTURING THE SAME

(75) Inventors: Tadahiro Ohmi, 1-17-301, Komegafukuro 2-Chome, Aoba-ku, Sendai-shi, Miyagi (JP); Akinobu Teramoto, Miyagi (JP)

(73) Assignees: Tadahiro Ohmi, Miyagi (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/558,760

(22) PCT Filed: May 31, 2004

(86) PCT No.: PCT/JP2004/007844

§ 371 (c)(1),
(2), (4) Date: Dec. 1, 2005

(87) PCT Pub. No.: WO2004/109790

PCT Pub. Date: Dec. 16, 2004

(65) Prior Publication Data

US 2007/0023780 A1 Feb. 1, 2007

(30) Foreign Application Priority Data

Jun. 4, 2003 (JP) .............................. 2003-159973

(51) Int. Cl.
*H01L 29/04* (2006.01)
*H01L 29/10* (2006.01)
*H01L 31/036* (2006.01)

(52) U.S. Cl. .............................. 257/64; 257/66; 257/67; 257/69; 257/369; 257/401; 257/E29.003; 257/E33.003; 257/E27.064

(58) Field of Classification Search .................. None
See application file for complete search history.

(56) References Cited

U.S. PATENT DOCUMENTS

| | | | |
|---|---|---|---|
| 6,222,234 B1 * | 4/2001 | Imai | 257/347 |
| 6,670,694 B2 | 12/2003 | Momose | |
| 7,202,534 B2 * | 4/2007 | Ohmi et al. | 257/369 |
| 2002/0011612 A1 | 1/2002 | Hieda | |
| 2002/0014666 A1 | 2/2002 | Ohmi et al. | |
| 2003/0227036 A1 * | 12/2003 | Sugiyama et al. | 257/288 |
| 2004/0245579 A1 * | 12/2004 | Ohmi et al. | 257/376 |
| 2004/0266076 A1 * | 12/2004 | Doris et al. | 438/157 |
| 2005/0167750 A1 * | 8/2005 | Yang et al. | 257/347 |

FOREIGN PATENT DOCUMENTS

| | | |
|---|---|---|
| JP | 4-256369 | 9/1992 |
| JP | 4-372166 | 12/1992 |
| JP | 4372166 | * 12/1992 |
| JP | 2001-160555 A | 6/2001 |
| JP | 2002-118255 A | 4/2002 |
| JP | 2002-359293 A | 12/2002 |
| JP | 2003-188273 A | 7/2003 |

OTHER PUBLICATIONS

B. Yu et al., "Fin FET Scaling to 10nm Gate Length," International Electron Devices Meeting (IEDM), Technical Digest 2002, pp. 251-254.

* cited by examiner

*Primary Examiner*—Andy Huynh
*Assistant Examiner*—Hoang-Quan Ho
(74) *Attorney, Agent, or Firm*—Foley & Lardner LLP

(57) ABSTRACT

A gate insulating film is formed using a plasma on a three-dimensional silicon substrate surface having a plurality of crystal orientations. The plasma gate insulating film experiences no increase in interface state in any crystal orientations and has a uniform thickness even at corner portions of the three-dimensional structure. By forming a high-quality gate insulating film using a plasma, there can be obtained a semiconductor device having good characteristics.

7 Claims, 2 Drawing Sheets

SEMICONDUCTOR DEVICE AND METHOD OF MANUFACTURING THE SAME

TECHNICAL FIELD

This invention relates to a semiconductor device having, like a double-gate structure or a triple-gate structure, a plurality of crystal orientations serving as transistors and a manufacturing method thereof.

BACKGROUND ART

In recent years, since the punch-through resistance has been strengthened to enable formation of short-channel transistors, semiconductor devices having a double-gate structure or a triple-gate structure have been proposed. The structure is such that a concave-convex portion is formed on a silicon substrate surface, a gate insulating film and a gate electrode are formed on side surfaces and an upper surface of the concave-convex portion, and the side surfaces or the side surfaces and upper surface of the silicon substrate surface are used as channels of a transistor. When the two side surfaces are used as the channels, it is called the double-gate structure, while, when the two side surfaces and the upper surface are used as the channels, it is called the triple-gate structure.

Not only in the case of the double-gate structure or the triple-gate structure, but also in the case of a single-gate structure, a gate insulating film such as a silicon oxide film is formed on the substrate surface. Conventionally, a silicon oxide film has been formed as a gate insulating film by a thermal oxidation technique.

However, when the gate insulating film is formed on the substrate surface by thermal treatment in the semiconductor device of the double-gate structure or the triple-gate structure, the interface states between silicon and the insulating film (Si/SiO$_2$) increase other than in a (100) crystal orientation to degrade the quality of the oxide film and, therefore, it has been difficult to obtain good characteristics as the semiconductor device. Further, there is a problem that the insulating film cannot be formed uniform at edge portions of the three-dimensional structure, and so on, so that an excellent gate insulating film cannot be obtained.

This invention has been made under the circumstances as described above and has an object to provide a semiconductor device manufacturing method that contributes to an improvement in characteristics of a semiconductor device, and a semiconductor device manufactured by such a manufacturing method.

DISCLOSURE OF THE INVENTION

According to this invention, a gate insulating film is formed using a plasma on a silicon substrate surface having a three-dimensional structure with a plurality of crystal orientations. The plasma gate insulating film exhibits no increase in interface state in any crystal orientations and has a uniform thickness even at corner portions of the three-dimensional structure. By forming the high-quality gate insulating film using the plasma, there is obtained a semiconductor device having excellent characteristics.

BEST MODE FOR CARRYING OUT THE INVENTION

Hereinbelow, a semiconductor device and a manufacturing method thereof according to this invention will be described with reference to the figures.

First Embodiment

Figure 1:
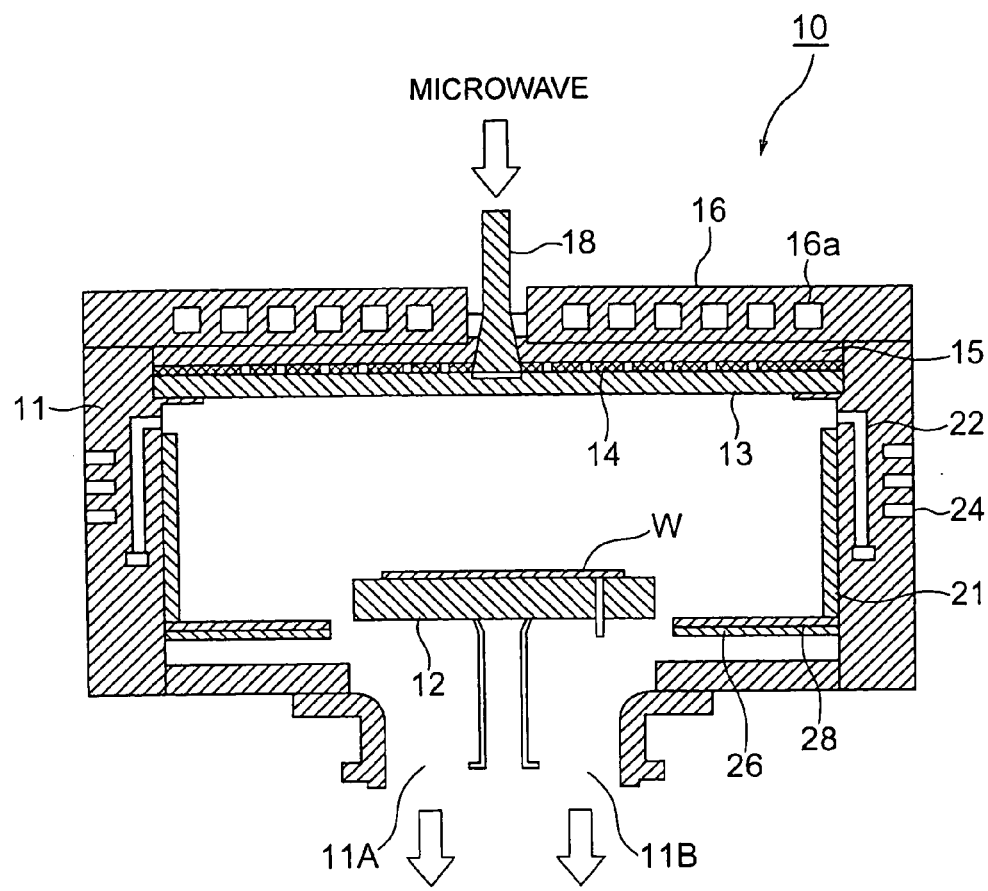
FIG. 1 is a schematic diagram (sectional view) showing one example of a structure of a plasma processing apparatus according to this invention.

FIG. 1 shows an example of a schematic structure of a plasma processing apparatus 10 used in this invention. The plasma processing apparatus 10 has a processing container 11 provided with a substrate holding stage 12 for holding a silicon wafer W as a substrate to be processed. Gas within the processing container 11 is exhausted from exhaust ports 11A and 11B through a non-illustrated exhaust pump. The substrate holding stage 12 has a heater function for heating the silicon wafer W. A gas baffle plate (partition plate) 26 made of aluminum is disposed around the substrate holding stage 12. A quartz cover 28 is provided on an upper surface of the gas baffle plate 26.

The processing container 11 is provided, in the apparatus upper part thereof, with an opening portion corresponding to the silicon wafer W on the substrate holding stage 12. This opening portion is closed by a dielectric plate 13 made of quartz or Al$_2$O$_3$. A planar antenna 14 is disposed on the upper side of the dielectric plate 13 (on the outer side of the processing container 11). The planar antenna 14 is formed with a plurality of slots for allowing an electromagnetic wave supplied from a waveguide to pass therethrough. A wavelength shortening plate 15 and the waveguide 18 are disposed on the further upper side (outer side) of the planar antenna 14. A cooling plate 16 is disposed on the outer side of the processing container 11 so as to cover the upper part of the wavelength shortening plate 15. A coolant path 16a where a coolant flows is provided inside the cooling plate 16.

An inner side wall of the processing container 11 is provided with a gas supply port 22 for introducing gases at the time of plasma processing. The gas supply port 22 may be provided for each of the gases to be introduced. In this case, a non-illustrated mass flow controller is provided per supply port as flow rate adjusting means. On the other hand, the gases to be introduced are mixed together in advance and then delivered so that the supply port 22 may be a single nozzle. Although not illustrated also in this case, the flow rate adjustment of the gases to be introduced is carried out by the use of flow rate adjusting valves or the like in the mixing stage. Further, a coolant flow path 24 is formed on the inner side of the inner wall of the processing container 11 so as to surround the whole container.

The plasma substrate processing apparatus 10 used in this invention is provided with a non-illustrated electromagnetic wave generator that generates an electromagnetic wave with several GHz for exciting a plasma. The microwave generated by this electromagnetic wave generator propagates in the waveguide 18 so as to be introduced into the processing container 11.

By the use of the plasma processing apparatus 10 having the structure as described above, a gate insulating film (oxide film) is formed on the substrate surface. At first, by a well-known method, for example, by polysilicon film formation according to a low-pressure CVD method, convex silicon blocks 52n and 52p are formed three-dimensionally in an area where transistors will be formed. The silicon wafer W having the silicon blocks 52n and 52p is introduced into the processing container 11 and set on the substrate holding stage 12. Thereafter, the gas inside the processing container 11 is exhausted through the exhaust ports 11A and 11B so that the inside of the processing container 11 is set to a predetermined processing pressure. Then, an inert gas and an oxygen gas are supplied from the gas supply port 22. As the inert gas, use is made of at least one of krypton (Kr), argon (Ar), and xenon (Xe).

On the other hand, the microwave with a frequency of several GHz generated by the electromagnetic wave generator is supplied to the processing container 11 passing through the waveguide 18. The microwave is introduced into the processing container 11 through the planar antenna 14 and the dielectric plate 13. A high-frequency plasma is excited by the microwave so that the reactive gas becomes radicals and a plasma gate oxide film is formed on the substrate surface of the silicon wafer W. The wafer temperature at the time of the formation of the plasma oxide film is 400° C. or less.

Figure 2:
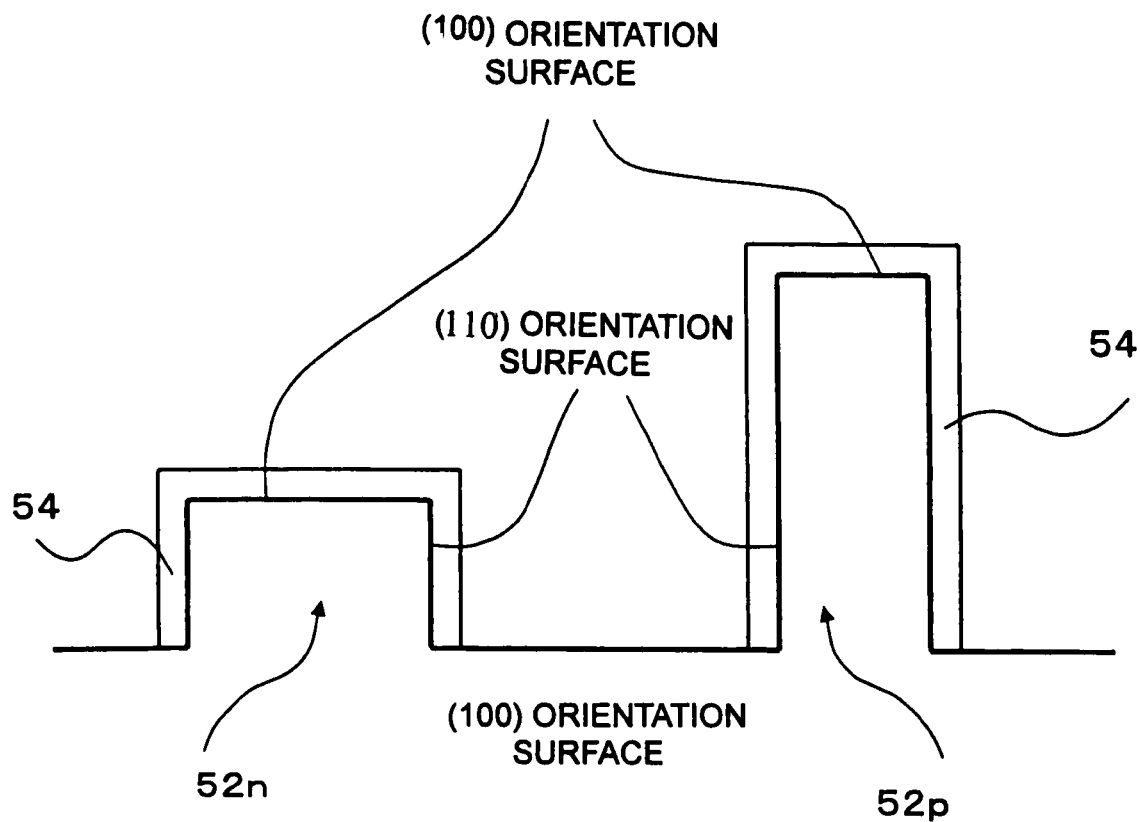
FIG. 2 schematically shows a transistor structure of a semiconductor device according to this invention.

FIG. 2 schematically shows an outline of a transistor structure of a semiconductor device according to this invention. In the semiconductor device, an NMOS transistor silicon block 52n where an NMOS transistor will be formed and a PMOS transistor silicon block 52p where a PMOS transistor will be formed are formed in a convex manner on a silicon substrate of the same crystal structure. A gate insulating film 54 is formed on both side surfaces and an upper surface of each of the silicon blocks 52n and 52p.

In the plasma processing apparatus shown in FIG. 1, by setting the film forming conditions such that the power was 2000 W, the pressure was 57 Pa, the temperature was 400° C., supply gases were argon and oxygen, and the time was 30 seconds, a gate oxide film was formed. An excellent result was obtained that variation σ in thickness was 0.67% and variation σ in interface state was 0.66% on the substrate having 300 mmΦ. The gate insulating film 54 formed using a plasma in the plasma processing apparatus was uniform in thickness even at edge portions of each silicon block and exhibited no increase in interface state in any crystal orientations.

Further, a gate electrode (not shown) is formed on each gate insulating film 54. By applying a proper voltage to the gate electrode, the transistor turns on/off. In the ON state of each transistor, assuming that, in FIG. 2, a source region is formed on this side of the sheet surface and a drain region is formed on the remote side, holes or electrons flow perpendicularly to the sheet surface from drain to source, i.e. from the remote side to this side. In this manner, the three sides, i.e. the two side surfaces and the upper surface, of each silicon block serve as channels to allow the current to flow. Since the three sides are used as the channels three-dimensionally, there is an advantage in achieving miniaturization of each transistor.

As shown in FIG. 2, crystal orientations in a plane (horizontal plane) direction of the silicon substrate become (100) orientations, while crystal orientations in a side surface (vertical plane) direction of the silicon blocks 52n and 52p become (110) orientations. It is designed such that the area of each side surface (vertical plane=(110) orientation) of the PMOS transistor silicon block 52p is set greater than that of the NMOS transistor silicon block 52n. Conversely, with respect to the area of the upper surface (horizontal plane=(100) orientation) of the silicon block, the PMOS transistor silicon block 52p is set smaller than the NMOS transistor silicon block 52n.

The speed of electrons (negative charge) flowing on the (100) orientation becomes faster by about 20% than that of electrons flowing on the (110) orientation. On the other hand, the speed of holes (positive charge) flowing on the (100) orientation becomes slower than that of holes flowing on the (110) orientation, which is about ⅓ of the latter. This invention has been made using such a principle. That is, a structure is adopted wherein more holes are allowed to flow on the (110) orientation and more electrons are allowed to flow on the (100) orientation. Herein, the crystal orientation includes what falls within the range of ±8° with respect to a crystal axis.

In this embodiment, since the example is given where the silicon substrate surface is the (100) orientation, the height of the silicon block 52n forming the NMOS transistor is set lower. However, when the silicon substrate surface is the (110) orientation, the height of the NMOS transistor silicon block 52n is set higher conversely to the case of FIG. 2. What is essential is to move holes and electrons more efficiently. In the figure, symbol 54 denotes the insulating film such as a silicon oxide film, a silicon nitride film, or a silicon oxynitride film.

When a convex silicon block is formed on a silicon substrate, an upper surface and side surfaces forming the silicon block have different crystal axes. Further, it has a three-dimensional structure and thus has corner portions. There is a drawback that when a gate oxide film is formed with respect to the different crystal orientations having the corner portions by the use of the conventional thermal oxidation method, the uniform thickness cannot be obtained at the corner portions. Further, as compared to the (100) crystal orientation, the interface state increases in the (110) crystal orientation to degrade the quality of the insulating film, so that a threshold voltage of a transistor differs in the crystal orientations. However, the gate insulating film 54 formed using the plasma in the plasma processing apparatus has a uniform thickness even at the corner portions of the silicon block and, further, there is no increase in interface state even in the (110) crystal orientation so that the excellent insulating film equivalent to the (100) crystal orientation can be obtained.

According to this invention, in a semiconductor device having a three-dimensional channel forming region, the channel forming region is configured such that channels have a plurality of crystal orientations and, of the plurality of crystal orientations, the area of the crystal orientation where the mobility of electrons or holes is large is set greater. Further, by forming a gate insulating film using a plasma on the surface of the plurality of crystal orientations, the excellent insulating film is obtained and thus the high-quality semiconductor device is obtained.

While the mode and embodiment of this invention have been described on the basis of some examples, this invention is not to be limited to those examples in any aspect, but can be modified within the category of technical thoughts as defined in the scope of claims.

The invention claimed is:

1. A semiconductor device having a plurality of crystal orientations at a silicon substrate surface, said semiconductor device comprising:
  an NMOS transistor and a PMOS transistor that are formed on the same substrate,
  wherein each of said transistors is formed with a gate insulating film, the gate insulating film of each of said transistors contacts a plurality of planes having the crystal orientations different from each other, a widest plane contacting said gate insulating film of said PMOS transistor is a (110) orientation, and a widest plane contacting said gate insulating film of said NMOS transistor is a (100) orientation.

2. The semiconductor device according to claim 1, wherein said gate insulating film comprises one of a silicon oxide film, a silicon oxynitride film, and a silicon nitride film.

3. The semiconductor device according to claim 1 or 2, wherein said gate insulating film contains at least one of krypton (Kr), argon (Ar), and xenon (Xe).

4. The semiconductor device according to claim 1 or 2, wherein said (110) orientation falls in a range of ±8°.

5. The semiconductor device according to claim 1, wherein:
- an NMOS transistor silicon block where said NMOS transistor is formed and a PMOS transistor silicon block where said PMOS transistor is formed are formed in a convex manner on said silicon substrate surface;
- the gate insulating film of each of said transistors contacts side surfaces and an upper surface of each of the silicon blocks; and
- said plurality of planes comprises the side surface and the upper surface of each of the silicon blocks.

6. The semiconductor device according to claim 5, wherein:
- when said silicon substrate surface is a (100) orientation, an area of each side surface of the PMOS transistor silicon block is greater than that of each side surface of the NMOS transistor silicon block and an area of the upper surface of the PMOS transistor silicon block is smaller than that of the upper surface of the NMOS transistor silicon block;
- the widest plane contacting said gate insulating film of said PMOS transistor is each side surface of the PMOS transistor silicon block which surface has a (110) orientation, and the widest plane contacting said gate insulating film of said NMOS transistor is the upper surface of the NMOS transistor silicon block which surface has a (100) orientation.

7. The semiconductor device according to claim 5, wherein:
- when said silicon substrate surface is a (110) orientation, an area of each side surface of the NMOS transistor silicon block is greater than that of each side surface of the PMOS transistor silicon block and an area of the upper surface of the NMOS transistor silicon block is smaller than that of the upper surface of the PMOS transistor silicon block;
- the widest plane contacting said gate insulating film of said NMOS transistor is each side surface of the NMOS transistor silicon block which surface has a (100) orientation, and the widest plane contacting said gate insulating film of said PMOS transistor is the upper surface of the PMOS transistor silicon block which surface has a (110) orientation.

* * * * *